(12) United States Patent
Zhai

(10) Patent No.: US 11,398,456 B2
(45) Date of Patent: Jul. 26, 2022

(54) WAFER LEVEL INTEGRATION OF PASSIVE DEVICES

(71) Applicant: Apple Inc., Cupertino, CA (US)

(72) Inventor: Jun Zhai, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/585,147

(22) Filed: Sep. 27, 2019

(65) Prior Publication Data
US 2020/0027861 A1 Jan. 23, 2020

Related U.S. Application Data

(63) Continuation of application No. 14/601,623, filed on Jan. 21, 2015, now Pat. No. 10,468,381.
(Continued)

(51) Int. Cl.
H01L 25/065 (2006.01)
H01L 25/00 (2006.01)
(Continued)

(52) U.S. Cl.
CPC .......... *H01L 25/0657* (2013.01); *H01L 21/56* (2013.01); *H01L 21/6835* (2013.01); *H01L 21/768* (2013.01); *H01L 21/78* (2013.01); *H01L 23/3107* (2013.01); *H01L 23/3114* (2013.01); *H01L 23/49822* (2013.01); *H01L 23/50* (2013.01); *H01L 23/528* (2013.01); *H01L 24/00* (2013.01); *H01L 24/09* (2013.01);
(Continued)

(58) Field of Classification Search
CPC ..... H01L 27/0617–101; H01L 23/5383; H01L 23/12–15
See application file for complete search history.

(56) References Cited

U.S. PATENT DOCUMENTS 4,080,590 A  3/1978 Pricer
6,335,566 B1  1/2002 Hirashima et al.
(Continued)

FOREIGN PATENT DOCUMENTS

CN  102103979 A  6/2011
KR  10-2008-0046115  5/2008
(Continued)

OTHER PUBLICATIONS

Invitation to Pay Additional Fees from PCT/US2014/048603, dated Nov. 17, 2014, Apple Inc., pp. 1-8.
(Continued)

*Primary Examiner* — Wael M Fahmy
*Assistant Examiner* — Quinton A Brasfield
(74) *Attorney, Agent, or Firm* — Kowert, Hood, Munyon, Rankin & Goetzel, P.C.; Gareth M. Sampson

(57) ABSTRACT

A semiconductor device is described that includes an integrated circuit coupled to a first semiconductor substrate with a first set of passive devices (e.g., inductors) on the first substrate. A second semiconductor substrate with a second set of passive devices (e.g., capacitors) may be coupled to the first substrate. Interconnects in the substrates may allow interconnection between the substrates and the integrated circuit. The passive devices may be used to provide voltage regulation for the integrated circuit. The substrates and integrated circuit may be coupled using metallization.

20 Claims, 7 Drawing Sheets

Related U.S. Application Data

(60) Provisional application No. 62/056,711, filed on Sep. 29, 2014.

(51) Int. Cl.

| | | |
|---|---|---|
| *H01L 49/02* | (2006.01) | |
| *H01L 23/528* | (2006.01) | |
| *H01L 21/78* | (2006.01) | |
| *H01L 21/683* | (2006.01) | |
| *H01L 21/768* | (2006.01) | |
| *H01L 23/00* | (2006.01) | |
| *H01L 21/56* | (2006.01) | |
| *H01L 23/31* | (2006.01) | |
| *H01L 23/498* | (2006.01) | |
| *H01L 23/50* | (2006.01) | |
| *H01L 25/16* | (2006.01) | |
| *H01G 4/40* | (2006.01) | |

(52) U.S. Cl.
CPC .............. *H01L 24/14* (2013.01); *H01L 24/89* (2013.01); *H01L 24/94* (2013.01); *H01L 24/97* (2013.01); *H01L 25/16* (2013.01); *H01L 25/50* (2013.01); *H01L 28/10* (2013.01); *H01L 28/40* (2013.01); *H01G 4/40* (2013.01); *H01L 24/13* (2013.01); *H01L 24/16* (2013.01); *H01L 24/29* (2013.01); *H01L 24/32* (2013.01); *H01L 2221/68327* (2013.01); *H01L 2224/0812* (2013.01); *H01L 2224/131* (2013.01); *H01L 2224/13147* (2013.01); *H01L 2224/1403* (2013.01); *H01L 2224/14181* (2013.01); *H01L 2224/16227* (2013.01); *H01L 2224/16235* (2013.01); *H01L 2224/16238* (2013.01); *H01L 2224/16268* (2013.01); *H01L 2224/2919* (2013.01); *H01L 2224/32013* (2013.01); *H01L 2224/32225* (2013.01); *H01L 2224/32265* (2013.01); *H01L 2224/73204* (2013.01); *H01L 2224/80001* (2013.01); *H01L 2224/81005* (2013.01); *H01L 2224/81193* (2013.01); *H01L 2224/83104* (2013.01); *H01L 2224/9202* (2013.01); *H01L 2224/92125* (2013.01); *H01L 2224/94* (2013.01); *H01L 2224/97* (2013.01); *H01L 2225/06548* (2013.01); *H01L 2225/06555* (2013.01); *H01L 2924/14* (2013.01); *H01L 2924/1432* (2013.01); *H01L 2924/19041* (2013.01); *H01L 2924/19042* (2013.01); *H01L 2924/19104* (2013.01); *H01L 2924/37001* (2013.01)

(56) References Cited

U.S. PATENT DOCUMENTS

| | | | |
|---|---|---|---|
| 7,952,160 | B2 | 5/2011 | Triantafillou et al. |
| 8,080,445 | B1 | 12/2011 | Pagaila |
| 8,341,434 | B2 | 12/2012 | Gervais et al. |
| 8,809,951 | B2 | 8/2014 | Lin et al. |
| 2002/0102768 | A1 | 8/2002 | Shioga et al. |
| 2005/0213267 | A1 | 9/2005 | Azrai et al. |
| 2007/0134925 | A1 | 6/2007 | Eilert |
| 2008/0100989 | A1 | 5/2008 | Chen |
| 2008/0128854 | A1 | 6/2008 | Augustine |
| 2008/0157343 | A1 | 7/2008 | Dattaguru et al. |
| 2008/0185614 | A1 | 8/2008 | Gamand et al. |
| 2008/0197491 | A1 | 8/2008 | Matsui et al. |
| 2009/0309212 | A1 | 12/2009 | Shim et al. |
| 2010/0308435 | A1 | 12/2010 | Nowak et al. |
| 2011/0068427 | A1 | 3/2011 | Paek et al. |
| 2011/0108948 | A1 | 5/2011 | Kim et al. |
| 2011/0248396 | A1* | 10/2011 | Liu .......................... H01L 25/50 438/459 |
| 2011/0294265 | A1 | 12/2011 | Shioga et al. |
| 2011/0317387 | A1 | 12/2011 | Pan et al. |
| 2012/0037969 | A1 | 2/2012 | Sanders et al. |
| 2012/0074582 | A1 | 3/2012 | Yu et al. |
| 2012/0112352 | A1 | 5/2012 | Chi et al. |
| 2012/0126416 | A1 | 5/2012 | Lee et al. |
| 2012/0217625 | A1 | 8/2012 | Mohan et al. |
| 2012/0289021 | A1 | 11/2012 | Ching et al. |
| 2012/0292738 | A1* | 11/2012 | Lin ....................... H01L 21/568 257/531 |
| 2013/0062761 | A1* | 3/2013 | Lin .................... H01L 25/0657 257/737 |
| 2013/0295727 | A1 | 11/2013 | Hsu et al. |
| 2014/0035158 | A1* | 2/2014 | Chang .................... H01L 25/50 438/109 |
| 2014/0138845 | A1 | 5/2014 | Kulkarni et al. |
| 2014/0252547 | A1 | 9/2014 | Chen et al. |
| 2015/0041955 | A1 | 2/2015 | Zerbe et al. |
| 2016/0093592 | A1 | 3/2016 | Zhai |

FOREIGN PATENT DOCUMENTS

| | | |
|---|---|---|
| WO | 00/39853 | 7/2000 |
| WO | 2006114772 | 2/2006 |

OTHER PUBLICATIONS

International Search Report and Written Opinion from PCT/US2014/048603, dated Feb. 12, 2015, Apple Inc., pp. 1-28.

ISSCC, "A Fully-Integrated 3-Level DC/DC Converter for Nanosecond-Scale DVS with Fast Shunt Regulation", Wonyoung Kim, et al., Feb. 22, 2011, pp. 268-270.

Proceedings of the IEEE, "Practical Strategies for Power-Efficient Computing Technologies", Leland Chang, et al., Feb. 2, 2010, pp. 215-236.

"A Fully-Integrated Switched-Capacitor 2:1 Voltage Converter with Regulation Capability and 90% Efficiency at 2.3A/mm2" Leland Chang, et al., 2010, pp. 55-56.

Invitation to Pay Additional Fees and Partial Search Results in application No. PCT/US2015/043688 dated Nov. 4, 2015, 9 pages.

International Search Report and Written Opinion in application No. PCT/US2015/043688 dated Mar. 18, 2016, 23 pages.

Office Action in ROC (Taiwan) Patent Application No. 104128208, dated Jun. 20, 2016, 24 pages.

IPRP, PCT/US2015/043688, dated Apr. 4, 2017, 15 pages.

Office Action, Korean Intellectual Property Office, KR Patent Application No. 10-2017-7005103, dated Apr. 17, 2018.

Rejection Decision, ROC (Taiwan) Pat. Appln. No. 104128208, Taiwan Intellectual Property Office (IPO), dated Sep. 26, 2016.

Office Action, Chinese Patent Office, Chinese Application for Invention No. 201580044816.7, dated Sep. 30, 2018.

Notice of Allowance, Korean Intellectual Property Office (KIPO), Korean Patent Application No. 10-2017-7005103, dated Oct. 30, 2018, 2 pages.

Office Action, DE 11 2015 004 444.2, National Phase in Germany of International Application No. PCTUS2015/043688, dated Nov. 6, 2018, 5 pages.

Office Action, Intellectual Property Office (IPO), ROC (Taiwan), Patent Application No. 104128208, dated Feb. 25, 2019, 10 pages.

Korean Intellectual Property Office; Patent Application No. 10-2019-7003309; Notice of Preliminary Rejection; dated Apr. 26, 2019, 7 pages.

Chinese Patent Office, Rejection Decision, Chinese Application for Invention No. 201580044816.7, dated Jul. 23, 2019, 22 pages.

* cited by examiner

WAFER LEVEL INTEGRATION OF PASSIVE DEVICES

PRIORITY CLAIM

This application is a continuation of U.S. patent application Ser. No. 14/601,623, filed Jan. 21, 2015, which claims benefit of priority of U.S. Provisional Patent Application No. 62/056,711 to Zhai, entitled "WAFER LEVEL INTEGRATION OF PASSIVE DEVICES", filed Sep. 29, 2014, which is incorporated by reference in its entirety.

BACKGROUND

1. Technical Field

Embodiments described herein relate to systems and methods for implementing power supply regulation in semiconductor devices. More particularly, the embodiments described herein relate to semiconductor devices with integrated passive devices for voltage regulation.

2. Description of Related Art

Power delivery along with power saving are increasingly factoring into integrated circuit device performance scaling for system on a chip (SoC) devices, central processing units (CPUs), and graphical processing units (GPUs). Delivering power more quickly to a device can increase the speed and power of the device while saving power by reducing losses during power transitions (e.g., powering on/off of the device). Further performance scaling may be limited without more efficient power delivery and power saving systems or techniques being developed. Thus, methods and systems for the inclusion of voltage regulation components (e.g., passive devices such as inductors and/or capacitors) on or near the integrated circuit die are being developed for further performance scaling.

One method of integrating voltage regulation on an integrated circuit die that has been developed is forming voltage regulation components on the die during processing used to make the die (e.g., forming inductors and capacitors during CMOS processing used to form the integrated circuit). Forming inductors and capacitors during CMOS processing, however, requires a complex process that can add cost, additional process time, require more masks, and/or more equipment. Because of the complexity involved in forming the inductors and capacitors on the integrated circuit die during the CMOS process, the yield loss in such integrated circuit die may be high, which leads to additional manufacturing time and cost. Additionally, because the inductors and capacitors are formed during the CMOS process, the specifications of the inductors and capacitors are limited by the CMOS process parameters.

Another method developed for inclusion of voltage regulation components on or near the integrated circuit die is providing discrete inductors and capacitors on-package with the integrated circuit die. Providing the inductors and capacitors on-package, however, may require large amounts of real estate space for the components, involve difficult physical routing, and be electrically inefficient with electrical losses.

SUMMARY

In certain embodiments, a semiconductor device includes an integrated circuit coupled to a first semiconductor substrate. The integrated circuit and the first substrate may be coupled using metallization formed on the integrated circuit and the first substrate. The first substrate may include a first set of passive devices (e.g., inductors) on the substrate. A second semiconductor substrate may be coupled to the first substrate such that the first substrate is between the integrated circuit and the second substrate. The first substrate and the second substrate may be coupled using metallization formed on the first substrate and the second substrate. The second substrate may include a second set of passive devices (e.g., capacitors). In some embodiments, electrically insulating material fills a space around the metallization between the integrated circuit and the first substrate and around metallization between the first substrate and the second substrate. In certain embodiments, the substrates include interconnects that provide interconnection between the substrates and the integrated circuit. These interconnects may connect the passive devices and the integrated circuit to provide voltage regulation for the integrated circuit.

In some embodiments, pillars are coupled to the active surface of the integrated circuit on a periphery of the first substrate and the second substrate. The pillars may provide direct connection to input/output terminals on the integrated circuit. Thus, input/output from the integrated circuit may occur directly without routing through the substrates with passive devices.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Figure 1:
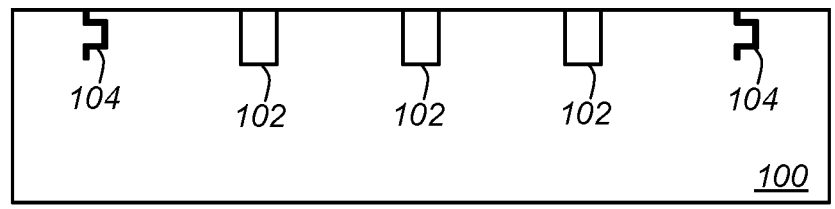
FIG. 1 depicts a cross-sectional side-view representation of an embodiment of a semiconductor substrate with passive devices and interconnects formed on the substrate.

While the embodiments described in this disclosure may be susceptible to various modifications and alternative forms, specific embodiments thereof are shown by way of example in the drawings and will herein be described in detail. The drawings may not be to scale. It should be understood that the drawings and detailed description thereto are not intended to limit the embodiments to the particular form disclosed, but to the contrary, the intention is to cover all modifications, equivalents and alternatives falling within the spirit and scope of the appended claims.

DETAILED DESCRIPTION OF EMBODIMENTS

FIG. 1 depicts a cross-sectional side-view representation of an embodiment of a semiconductor substrate with passive devices and interconnects formed on the substrate. Substrate 100 may be a semiconductor substrate such as, but not limited to, a silicon substrate or a silicon wafer. In certain embodiments, passive devices 102 are formed on or in substrate 100. In certain embodiments, passive devices 102 are inductors. For example, passive devices 102 may be thin film inductors.

In certain embodiments, interconnects 104 are formed in substrate 100. Interconnects 104 may be partial vias or other three-dimensional interconnects formed in substrate 100 that are filled with conductive material (e.g., a metal such as copper). For example, interconnects 104 may be copper pillars or copper/solder pillars in substrate 100. Passive devices 102 and/or interconnects 104 may have a selected maximum depth in substrate 100. The selected maximum depth may allow portions of passive devices 102 and/or interconnects 104 to be exposed during later processing of substrate 100 (e.g., exposed after removal of a bottom portion of the substrate).

Figure 2:
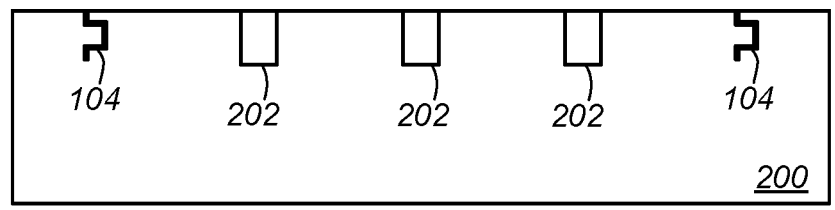
FIG. 2 depicts a cross-sectional side-view representation of another embodiment of a semiconductor substrate with passive devices and interconnects formed on the substrate.

FIG. 2 depicts a cross-sectional side-view representation of another embodiment of a semiconductor substrate with passive devices and interconnects formed on the substrate. Substrate 200 may be a semiconductor substrate such as, but not limited to, a silicon substrate or a silicon wafer. In certain embodiments, passive devices 202 are formed on or in substrate 200. In certain embodiments, passive devices 202 are capacitors. For example, passive devices 202 may be trench capacitors.

In certain embodiments, interconnects 104 are formed in substrate 200. Passive devices 202 and/or interconnects 104 may have a selected maximum depth in substrate 200. The selected maximum depth may allow portions of passive devices 202 and/or interconnects 104 to be exposed during later processing of substrate 200 (e.g., exposed after removal of a bottom portion of the substrate).

Figure 3:
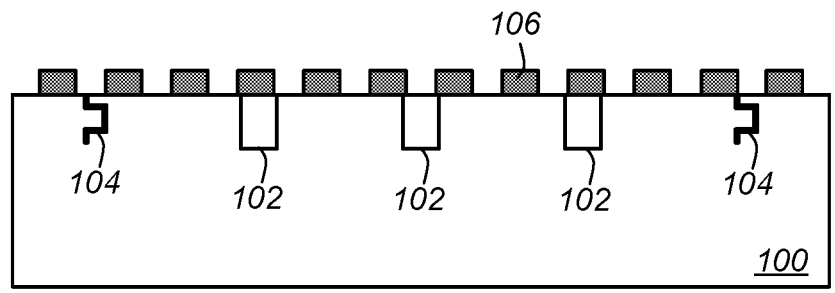
FIG. 3 depicts a cross-sectional side-view representation of an embodiment of metallization formed on a semiconductor substrate.
Figure 4:
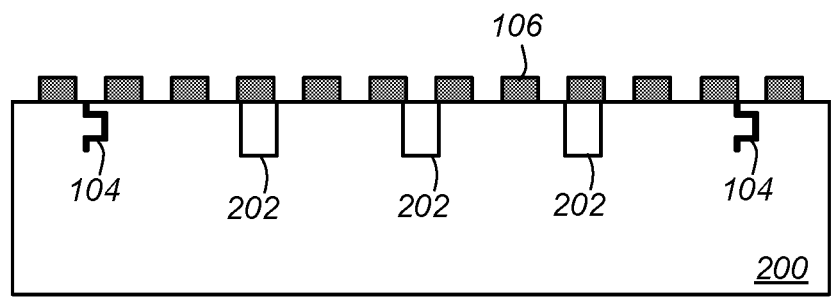
FIG. 4 depicts a cross-sectional side-view representation of another embodiment of metallization formed on a semiconductor substrate.

FIG. 3 depicts a cross-sectional side-view representation of an embodiment of metallization 106 formed on substrate 100. FIG. 4 depicts a cross-sectional side-view representation of an embodiment of metallization 106 formed on substrate 200. In some embodiments, metallization 106 includes a metal film patterned on a surface of substrate 100 and/or a surface of substrate 200. Metallization 106 may be, for example, copper patterned on the surface of substrate 100 and/or substrate 200. Metallization 106 may include pads or other terminals connected to passive devices 102, 202 and/or interconnects 104.

Figure 5:
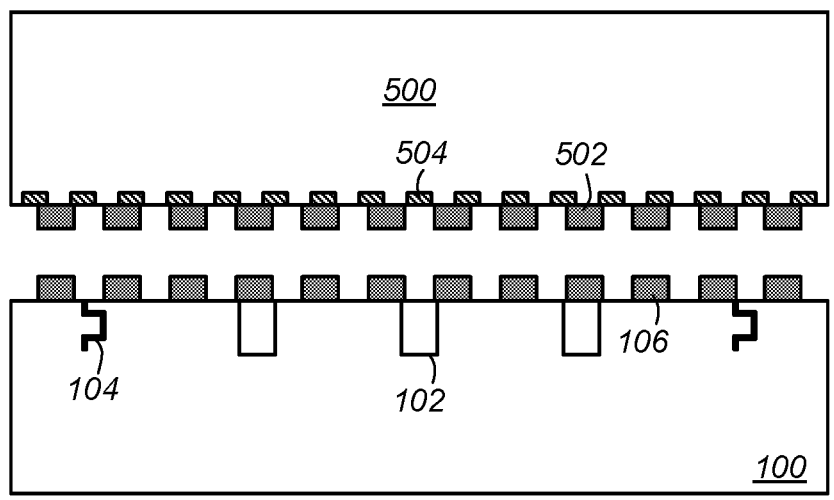
FIG. 5 depicts a cross-sectional side-view representation of an embodiment of a semiconductor substrate with metallization being coupled to an integrated circuit.

In certain embodiments, substrate 100 with metallization 106, shown in FIG. 3, is coupled to an integrated circuit using the metallization. FIG. 5 depicts a cross-sectional side-view representation of substrate 100 with metallization 106 being coupled to integrated circuit 500. (integrated circuit 500 may include, but not be limited to, a system on a chip (SoC), graphical processing unit (GPU), central processing unit (CPU), coprocessors, bridge processors, and any other primary, secondary, or peripheral semiconductor processor that utilizes voltage regulation. For example, integrated circuit 500 may be a power consuming semiconductor device (e.g., a device with current consumption elements such as an SOC). In certain embodiments, integrated circuit 500 is formed using a CMOS (complementary metal-oxide-semiconductor) process. It is to be understood, however, that integrated circuit 500 may be formed using other processes known in the art.

In certain embodiments, metallization 502 is formed on integrated circuit 500. Metallization 502 may be coupled to active surface 504 (e.g., the active side) of integrated circuit 500. Active surface 504 may include terminals or connections to active circuitry in integrated circuit 500. In certain embodiments, metallization 502 has a pattern that mirrors metallization 106 on substrate 100, as shown in FIG. 5.

In certain embodiments, integrated circuit 500 is positioned on a carrier. The carrier may support a plurality of integrated circuits. In some embodiments, semiconductor substrate 100 is a semiconductor wafer sized to couple to all the plurality of integrated circuits on the carrier (e.g., the semiconductor (wafer) substrate is coupled to the integrated circuits in a wafer level process). Semiconductor substrate 100 (e.g., the semiconductor wafer) is then separated (e.g., diced) during later processing to form distinct devices.

Coupling a plurality of integrated circuits 500 and semiconductor substrate 100 in a wafer level process may provide a high throughput process.

In some embodiments, semiconductor substrate 100 and/or semiconductor substrate 200 are individual substrates coupled distinctly to integrated circuit 500 (e.g., the semiconductor substrates are sized to match the integrated circuit). The distinct semiconductor substrates may be formed by dicing or otherwise separating a semiconductor wafer to form distinct semiconductor substrates. The distinct semiconductor substrates may then be coupled to individual integrated circuits 500 (either on the carrier or off the carrier). In certain embodiments, because distinct semiconductor substrates are coupled to individual integrated circuits, it is possible to allow only coupling of only yielded semiconductor substrates and integrated circuits. Coupling only yielded semiconductor substrates and integrated circuits may increase overall yield of the process described herein.

Figure 6:
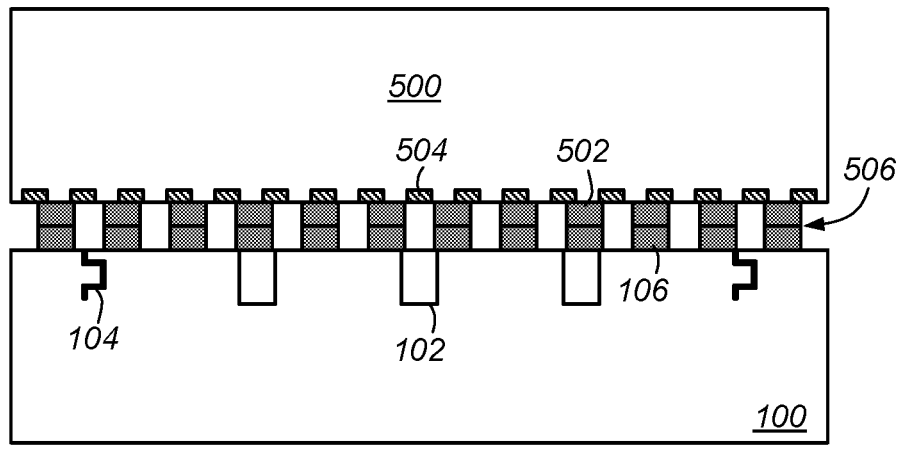
FIG. 6 depicts a cross-sectional side-view representation of an embodiment of a semiconductor substrate coupled to an integrated circuit.

FIG. 6 depicts a cross-sectional side-view representation of substrate 100 coupled to integrated circuit 500. In certain embodiments, as shown in FIG. 6, substrate 100 is coupled to integrated circuit by coupling metallization 106 to metallization 502 to form combined metallization 506. Metallization 506 may be formed using technology known in the art for joining metallization. For example, metallization 506 may be formed using copper/solder/copper technology or copper pillar technology.

Figure 7:
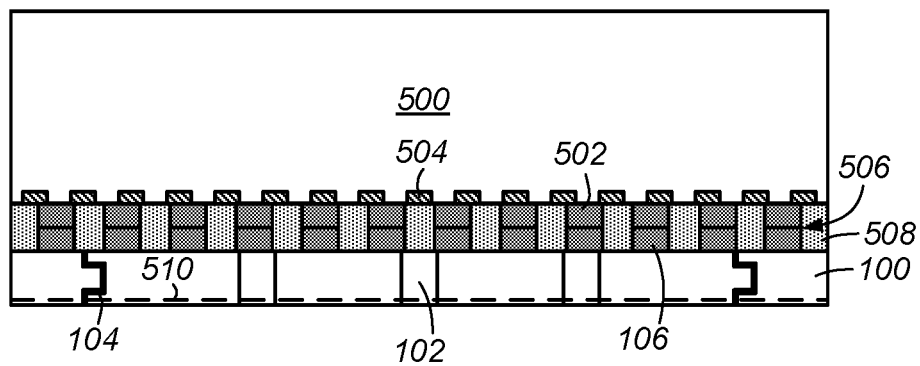
FIG. 7 depicts a cross-sectional side-view representation of an embodiment of a semiconductor substrate coupled to an integrated circuit with electrically insulating material filling the gap between the substrate and the integrated circuit and a portion of the substrate removed.

In certain embodiments, after semiconductor substrate 100 is coupled to integrated circuit 500, electrically insulating material 508 is filled into the space (gap) between the upper surface of the substrate and the lower (active) surface of the integrated circuit, as shown in FIG. 7. Electrically insulating material 508 may fill the space (gaps) around metallization 600 between semiconductor substrate 100 and integrated circuit 500. Electrically insulating material 508 may be, for example, a polymer or epoxy material such as an underfill material or an encapsulation material. Underfill material may include, but not be limited to, a capillary underfill material used in flip-chip bonding processes such as a snap cure underfill material or a low profile underfill material. Encapsulation material may include, but not be limited to, a polymer or a mold compound such as an overmold or exposed mold.

In certain embodiments, as shown in FIG. 7, a (lower) portion of semiconductor substrate 100 is removed. The lower portion of semiconductor substrate 100 may be removed, for example, by thinning of the substrate using technology known in the art (e.g., CMP (chemical mechanical polishing) or grinding). In certain embodiments, removing the lower portion of semiconductor substrate 100 exposes at least some interconnects 104 on the lower surface of the substrate. In some embodiments, removing the lower portion of semiconductor substrate 100 exposes at least some passive devices 102 and at least some interconnects 104.

In some embodiments, redistribution layer (RDL) 510 is located on the lower portion of substrate 100. RDL 510 may include one or more layers of routing. The routing may be, for example, copper wiring or another suitable electrical conductor wiring that redistributes connections on one side of RDL 510 to another displaced (e.g., horizontally displaced) location on the other side of the RDL (e.g., the routing interconnects connections (terminals) on the top and bottom of the RDL that are horizontally offset). Thus, RDL 510 may be used to redistribute connections for interconnects 104 and/or passive devices 102.

In some embodiments, RDL 510 is formed as a part of semiconductor substrate 100 and is exposed after the lower portion of the semiconductor substrate is removed. In some embodiments, RDL 510 is formed on the lower surface of semiconductor substrate 100 after the lower portion of the semiconductor substrate is removed.

Figure 8:
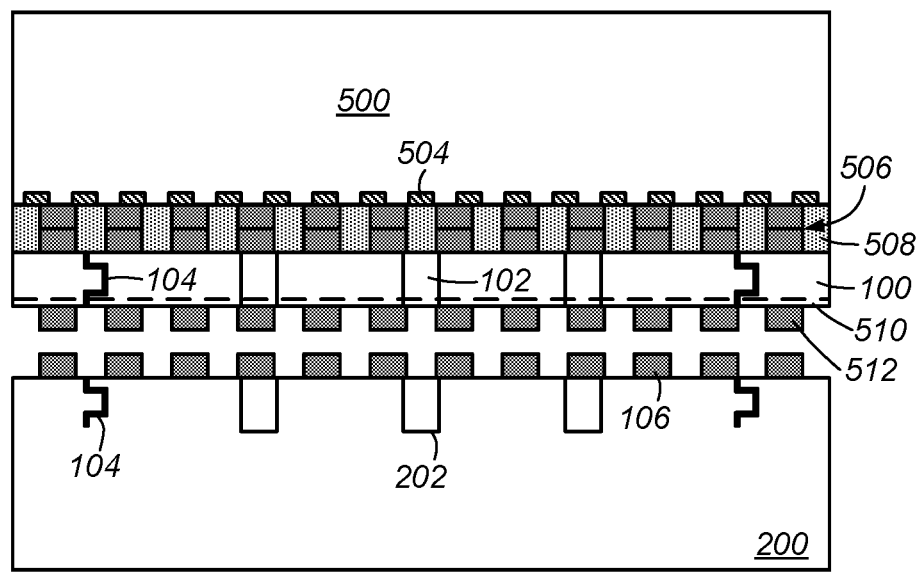
FIG. 8 depicts a cross-sectional side-view representation of an embodiment of a semiconductor substrate coupled to a substrate coupled to an integrated circuit.

In certain embodiments, after the lower portion of semiconductor substrate 100 is removed, metallization 512 is formed on the lower surface of the semiconductor substrate, as shown in FIG. 8. Metallization 512 may be formed directly on the lower surface of semiconductor substrate 100 or on the surface of RDL 510 (shown in FIG. 7). In some embodiments, metallization 512 may be formed as part of RDL 510 (e.g., the RDL includes the metallization on the lower surface of the RDL).

Metallization 512 may be used to couple semiconductor substrate 100 to semiconductor substrate 200, as shown in FIG. 8. In some embodiments, semiconductor substrate 200 is a semiconductor wafer sized to couple to all the plurality of integrated circuits on the carrier (e.g., the semiconductor (wafer) substrate is coupled, along with semiconductor substrate 100, to the integrated circuits in a wafer level process). In some embodiments, semiconductor substrate 200 is an individual substrate coupled distinctly to semiconductor substrate 100 (e.g., the semiconductor substrates are sized to match integrated circuit 500).

Figure 9:
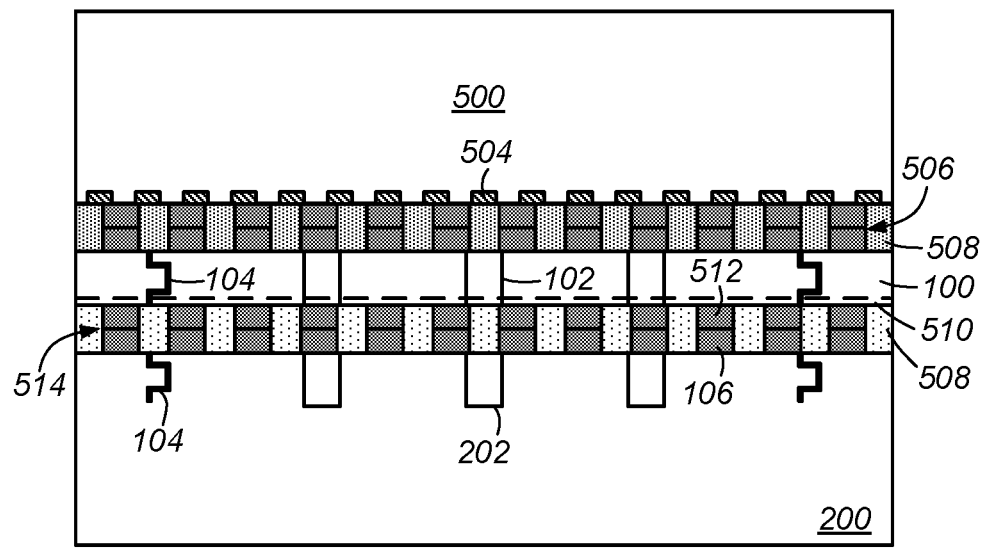
FIG. 9 depicts a cross-sectional side-view representation of an embodiment of a semiconductor substrate coupled to a substrate coupled to an integrated circuit with electrically insulating material filling the space between the substrates.

In certain embodiments, metallization 512 is coupled to metallization 106 on semiconductor substrate 200 to form combined metallization 514, shown in FIG. 9. Metallization 514 may be formed using technology known in the art for joining metallization. In certain embodiments, after semiconductor substrate 100 is coupled to semiconductor substrate 200, electrically insulating material 508 is filled into the space (gap) between the lower surface of semiconductor substrate 100 and the upper surface of semiconductor substrate 200, as shown in FIG. 9. Electrically insulating material 508 may fill the space (gaps) around metallization 514 between semiconductor substrate 100 and semiconductor substrate 200.

Figure 10:
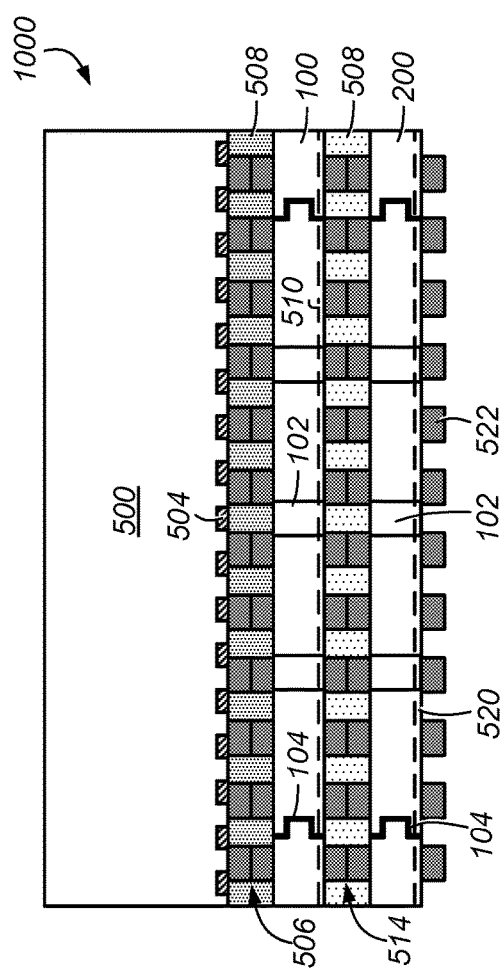
FIG. 10 depicts a cross-sectional side-view representation of an embodiment of a semiconductor device.

In certain embodiments, as shown in FIG. 10, a (lower) portion of semiconductor substrate 200 is removed. The lower portion of semiconductor substrate 200 may be removed, for example, by thinning of the substrate using technology known in the art. In certain embodiments, removing the lower portion of semiconductor substrate 200 exposes at least some interconnects 104 on the lower surface of the substrate. In some embodiments, removing the lower portion of semiconductor substrate 200 exposes at least some passive devices 202 and at least some interconnects 104.

In some embodiments, redistribution layer (RDL) 520 is located on the lower portion of substrate 200. RDL 520 may be used to redistribute connections for interconnects 104 and/or passive devices 202. In some embodiments, RDL 520 is formed as a part of semiconductor substrate 200 and is exposed after the lower portion of the semiconductor substrate is removed. In some embodiments, RDL 520 is formed on the lower surface of semiconductor substrate 200 after the lower portion of the semiconductor substrate is removed.

In certain embodiments, after the lower portion of semiconductor substrate 200 is removed, metallization 522 is formed on the lower surface of the semiconductor substrate, as shown in FIG. 10. Metallization 522 may be formed directly on the lower surface of semiconductor substrate 200 or on the surface RDL 520. In some embodiments, metallization 522 may be formed as part of RDL 520 (e.g., the RDL includes the metallization on the lower surface of the RDL). Metallization 522 may provide terminals for connection to semiconductor substrate 200, semicondutor substrate 100, and/or integrated circuit 500. Semiconductor substrate 200 may be directly coupled to metallization 522. Integrated circuit 500 and semiconductor substrate 100 may be coupled to metallization 522 using one or more interconnects 104 (in both substrates) and/or the RDLs on the substrates. Metallization 522 may then be used to couple integrated circuit 500, semiconductor substrate 100, and/or semiconductor substrate 200 to, for example, another device, a package, or a printed circuit board.

In certain embodiments, integrated circuit 500, semiconductor substrate 100, semiconductor substrate 200, and their intervening components form semiconductor device 1000, as shown in FIG. 10. For a wafer level process as described herein, semiconductor device 1000 may be formed by removing integrated circuits 500 from the carrier and separating (dicing) the structure, including the semiconductor wafers used for semiconductor substrate 100 and semiconductor substrate 200, along selected boundaries to form distinct semiconductor devices that include individual integrated circuits. In some embodiments, integrated circuits 500 remain on the carrier during separation (dicing) and semiconductor devices 1000 are removed from the carrier after separation (dicing). In some embodiments, semiconductor device 1000 may be further processed to be placed in a package or other structure.

Figure 11:
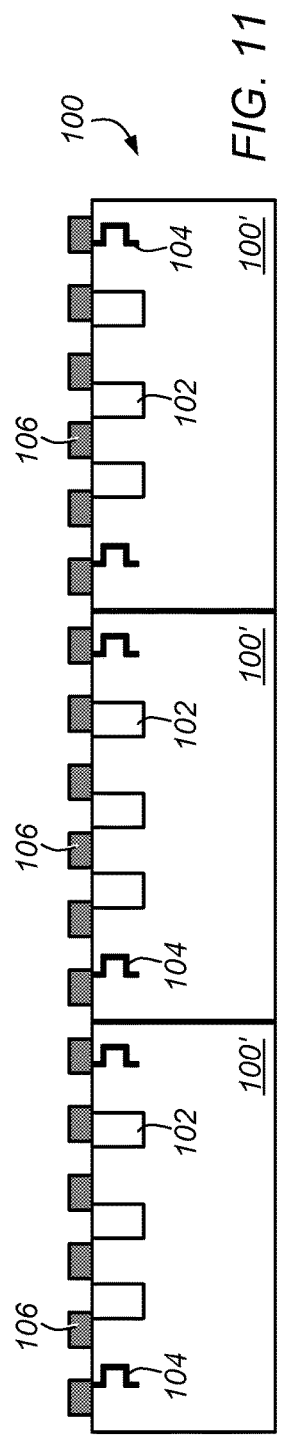
FIG. 11 depicts a cross-sectional side-view representation of an embodiment of a semiconductor substrate with separation lines.
Figure 12:
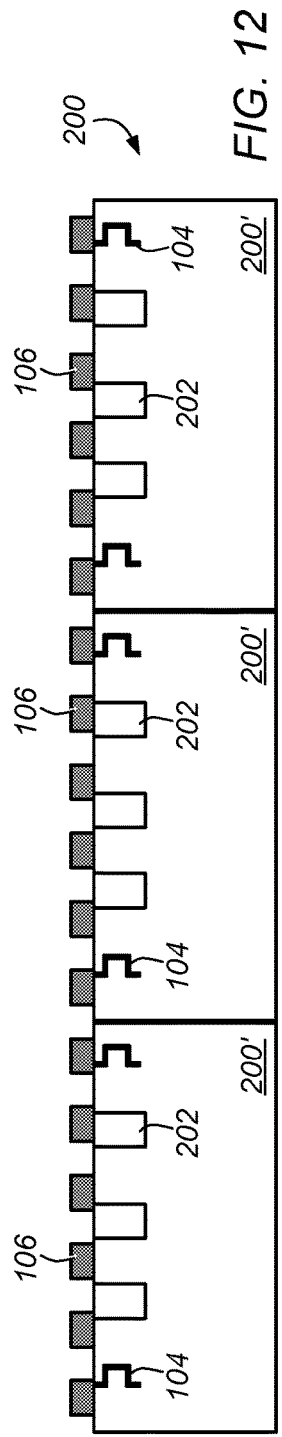
FIG. 12 depicts a cross-sectional side-view representation of another embodiment of a semiconductor substrate with separation lines.

In certain embodiments, semiconductor wafers that include semiconductor substrate 100 and semiconductor substrate 200 are separated to form substrates with a smaller width than integrated circuit 500. FIG. 11 depicts a cross-sectional side-view representation of an embodiment of semiconductor substrate 100 with separation lines. FIG. 12 depicts a cross-sectional side-view representation of an embodiment of semiconductor substrate 200 with separation lines. Metallization 106 may be formed on semiconductor substrate 100 and semiconductor substrate 200 before separation (dicing) of the substrates. Separation of semiconductor substrate 100, as shown in FIG. 11, may form semiconductor substrates 100'. Separation of semiconductor substrate 200, as shown in FIG. 12, may form semiconductor substrates 200'.

Figure 13:
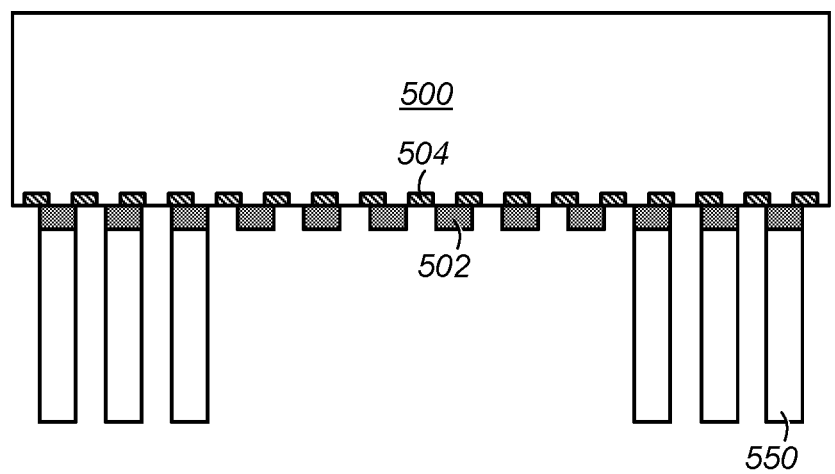
FIG. 13 depicts a cross-sectional side-view representation of an embodiment of an integrated circuit with pillars coupled to metallization on a peripheral portion of the integrated circuit.

FIG. 13 depicts a cross-sectional side-view representation of an embodiment of integrated circuit 500 with pillars 550 coupled to metallization 502 on a peripheral portion of the integrated circuit. Pillars 550 may be, for example, copper pillars or pillars made from another suitable conductor. Pillars 550 may be formed using electroplating (e.g., copper electroplating). In certain embodiments, pillars 550 are coupled to input/output terminals on active surface 504 of integrated circuit 500. Terminals on active surface 504 that are not used for input/output may be used for power (voltage) regulation connections to integrated circuit 500. Pillars 550 may have a larger height than metallization 502. For example, in one embodiment, pillars 550 have a height of about 60 µm while metallization 502 has a height of about 10 µm.

Figure 14:
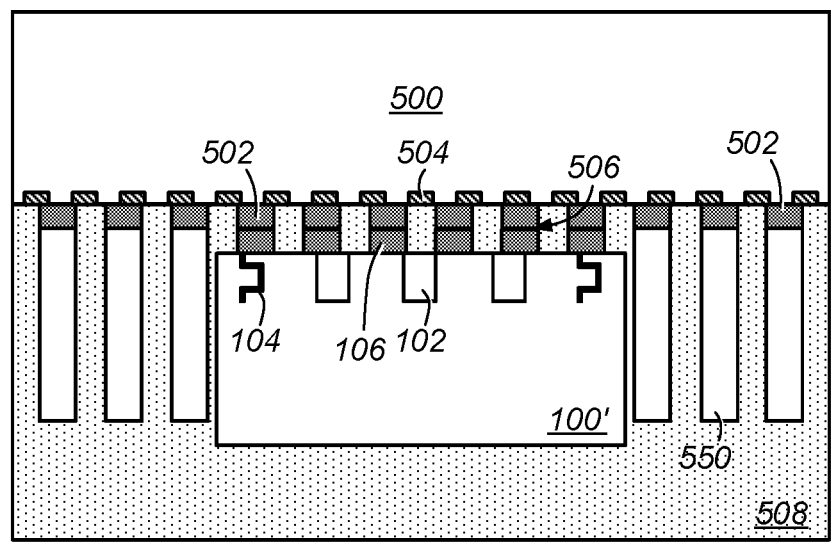
FIG. 14 depicts a cross-sectional side-view representation of an embodiment of an integrated circuit with pillars and a semiconductor substrate coupled to the integrated circuit.

Pillars 550 may be formed on the peripheral portion to allow semiconductor substrate 100' to be positioned inside the peripheral portion and connected to metallization 502 without pillars 550, as shown in FIG. 14. Pillars 550 are then located on the periphery of semiconductor substrate 100'. Semiconductor substrate 100' may be coupled to integrated circuit 500 using metallization 106 and metallization 502 to form combined metallization 506 as described herein. Because semiconductor substrate 100' is coupled to integrated circuit 500 inside the peripheral portion of the integrated circuit coupled to pillars 550, the substrate is distinctly coupled to the integrated circuit (e.g., the substrate is coupled in an individual process level instead of a wafer level process).

After coupling semiconductor substrate 100' to integrated circuit 500, electrically insulating material 508 is filled into the space (gap) between the upper surface of the substrate and the lower (active) surface of the integrated circuit. Electrically insulating material 508 also surrounds semiconductor substrate 100' and pillars 550, as shown in FIG. 14.

Figure 15:
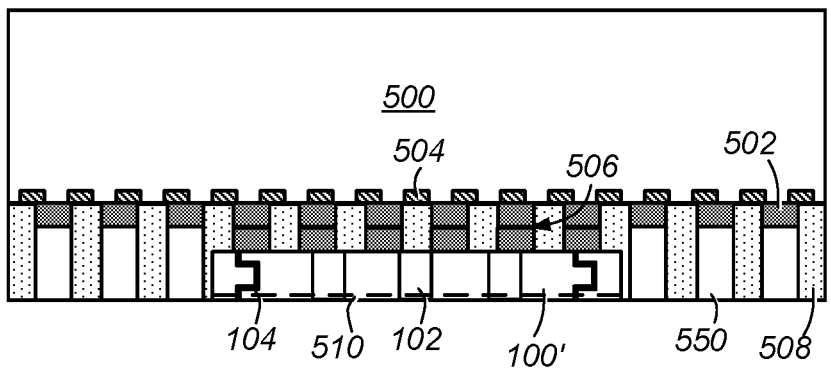
FIG. 15 depicts a cross-sectional side-view representation of an embodiment of an integrated circuit with pillars and a semiconductor substrate coupled to the integrated circuit with a portion of the substrate and pillars removed.

In certain embodiments, as shown in FIG. 15, lower portions of semiconductor substrate 100', pillars 550, and electrically insulating material 508 are removed. The lower portions may be removed, for example, by thinning of the substrate using technology known in the art (e.g., CMP or grinding). In certain embodiments, removing the lower portion of semiconductor substrate 100' exposes at least some interconnects 104 on the lower surface of the substrate. In some embodiments, removing the lower portion of semiconductor substrate 100' exposes at least some passive devices 102 and at least some interconnects 104. As shown in FIG. 15, pillars 550 and electrically insulating material 508 are thinned to the same level as semiconductor substrate 100' with at least a portion of the pillars exposed on the surface of the electrically insulating material. In some embodiments, redistribution layer (RDL) 510 is located on the lower portion of substrate 100'.

Figure 16:
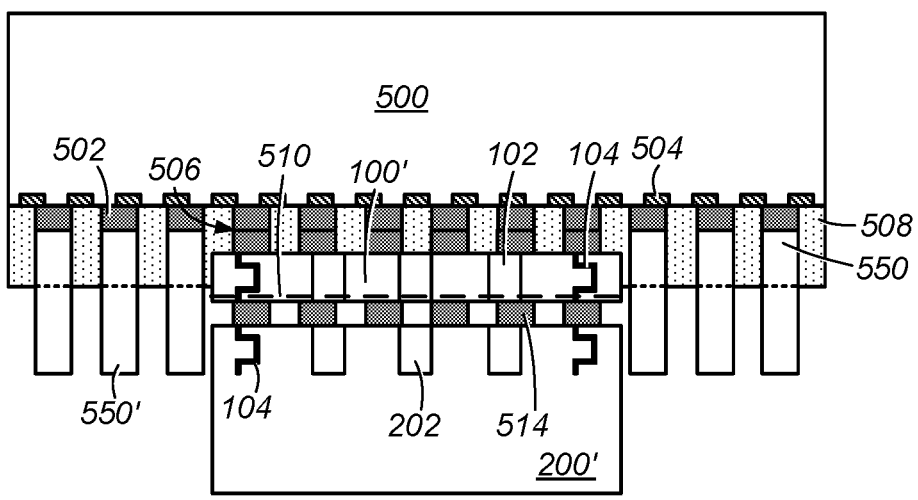
FIG. 16 depicts a cross-sectional side-view representation of an embodiment of an integrated circuit with pillars and a semiconductor substrate coupled to the integrated circuit and another semiconductor substrate coupled to the semiconductor substrate and pillar extensions coupled to the pillars.

In certain embodiments, after removing the lower portions of semiconductor substrate 100', pillars 550, and electrically insulating material 508, pillar extensions 550' are coupled to the remaining portion of pillars 550, as shown in FIG. 16. Pillar extensions 550' may be formed, for example, by electroplating. Pillar extensions 550' may be formed on the periphery of semiconductor substrate 100'.

In certain embodiments, semiconductor substrate 200' is coupled to semiconductor substrate 100' inside the peripheral portion formed by pillars 550 and pillar extensions 550', as shown in FIG. 16. Semiconductor substrate 200' may be coupled to semiconductor substrate 100' using metallization 106 and metallization 512 to form combined metallization 514 as described herein.

Figure 17:
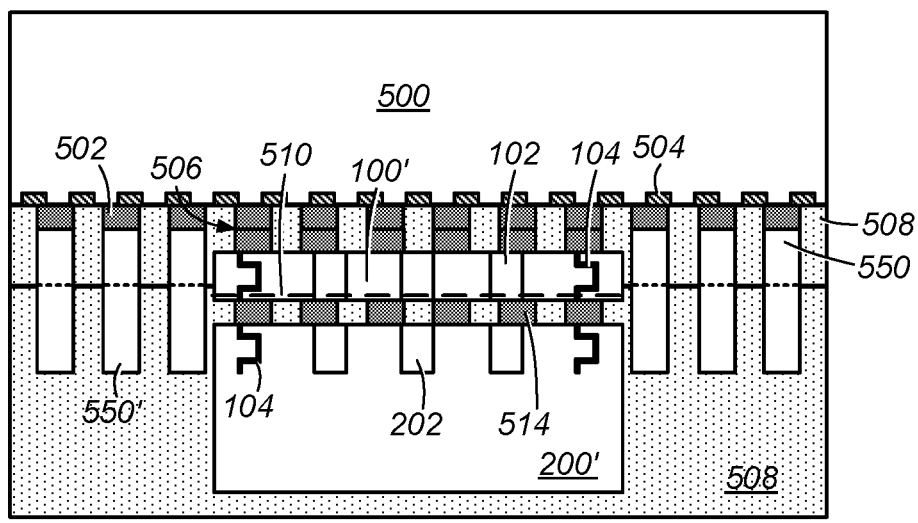
FIG. 17 depicts a cross-sectional side-view representation of an embodiment of an integrated circuit with pillars and a semiconductor substrate coupled to the integrated circuit and another semiconductor substrate coupled to the semiconductor substrate and pillar extensions coupled to the pillars surrounded by electrically insulating material.

After coupling semiconductor substrate 200' to semiconductor substrate 100', electrically insulating material 508 is filled into the space (gap) between the upper surface of semiconductor substrate 200' and the lower surface of semiconductor substrate 100', as shown in FIG. 17. Electrically insulating material 508 also surrounds semiconductor substrate 200' and pillar extensions 550'.

Figure 18:
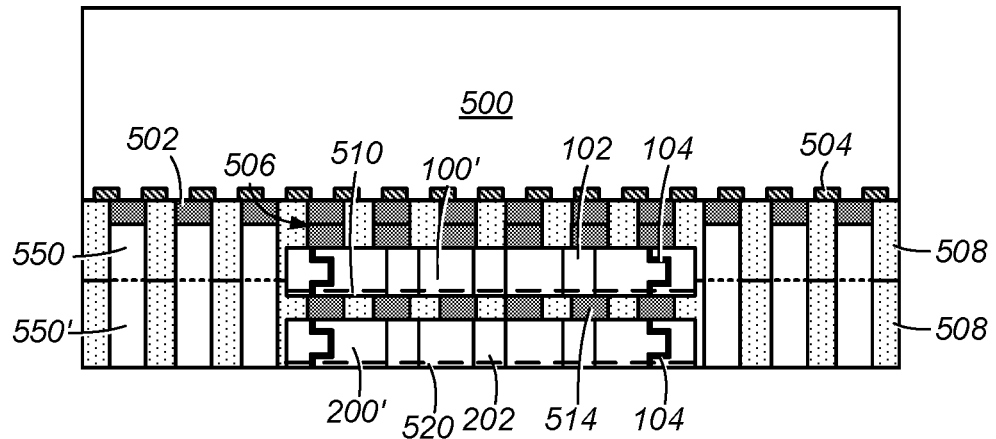
FIG. 18 depicts a cross-sectional side-view representation of an embodiment of an integrated circuit with pillars and a semiconductor substrate coupled to the integrated circuit and another semiconductor substrate coupled to the semiconductor substrate and pillar extensions coupled to the pillars with a portion of the another semiconductor substrate and pillar extensions removed.

In certain embodiments, as shown in FIG. 18, lower portions of semiconductor substrate 200', pillar extensions 550', and electrically insulating material 508 are removed. In certain embodiments, removing the lower portion of semiconductor substrate 200' exposes at least some interconnects 104 on the lower surface of the substrate. In some embodiments, removing the lower portion of semiconductor substrate 200' exposes at least some passive devices 202 and at least some interconnects 104. In some embodiments, redistribution layer (RDL) 520 is located on the lower portion of substrate 200'.

As shown in FIG. 18, pillar extensions 550' and electrically insulating material 508 are thinned to the same level as semiconductor substrate 200' with at least a portion of the pillar extensions exposed on the surface of the electrically insulating material. Thus, pillars 550 and pillar extensions 550' (the "pillars") provide direct electrical connection to input/output terminals of integrated circuit 500 with the pillars having a height approximately equal to a height of connections (e.g., terminals) on the exposed surface of semiconductor substrate 200'.

Figure 19:
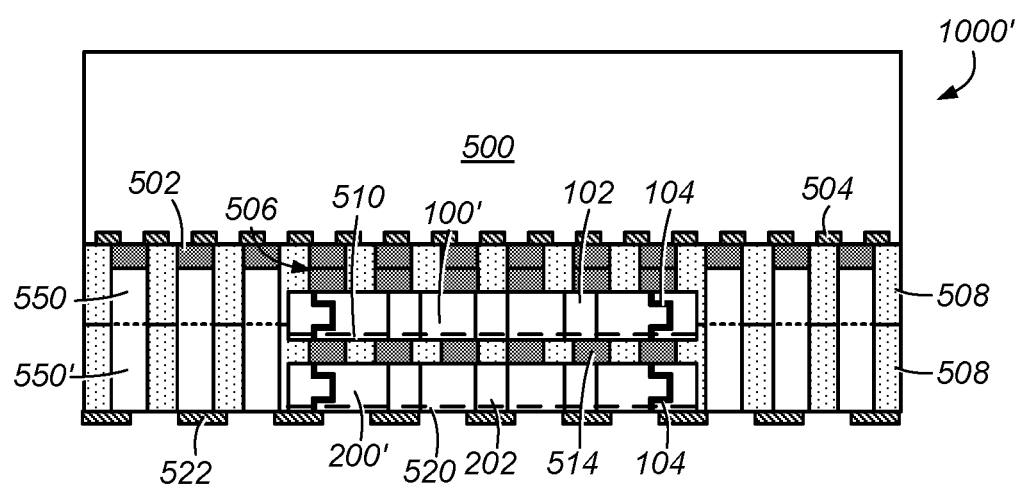
FIG. 19 depicts a cross-sectional side-view representation of another embodiment of a semiconductor device.

In certain embodiments, after the lower portions of semiconductor substrate 200', pillar extensions 550', and electrically insulating material 508 are removed, metallization 522 is formed on the lower surfaces of the semiconductor substrate, pillar extensions, and electrically insulating material, as shown in FIG. 19. In some embodiments, at least some metallization 522 is in contact with pillar extensions 550'. Metallization 522 may provide terminals for connection to semiconductor substrate 200', semicondutor substrate 100', and/or integrated circuit 500. Semiconductor substrate 200' may be directly coupled to metallization 522. Integrated circuit 500 may be coupled to metallization 522 using pillars 550 and pillar extensions 550' (to provide direct input/output terminals for the integrated circuit) and/or the integrated circuit may be coupled to the metallization using one or more interconnects 104 (in both substrates) and/or the RDLs on the substrates. Semiconductor substrate 100' may be coupled to metallization 522 using one or more interconnects 104 and/or the RDLs on the substrates. Metallization 522 may then be used to couple integrated circuit 500, semiconductor substrate 100', and/or semiconductor substrate 200' to, for example, another device, a package, or a printed circuit board.

In certain embodiments, integrated circuit 500, semiconductor substrate 100', semiconductor substrate 200', pillars 550, pillar extensions 550', and their intervening components form semiconductor device 1000', as shown in FIG. 19. In some embodiments, semiconductor device 1000' may be further processed to be placed in a package or other structure.

While semiconductor device 1000 and semiconductor device 1000' are shown herein with semiconductor substrate 100 coupled between integrated circuit 500 and semiconductor substrate 200 such that passive devices 102 (e.g., the inductors) are nearer the integrated circuit than passive devices 202 (e.g., the capacitors). It is to be understood that the positions of the semiconductor substrates and/or passive devices may be varied as desired. For example, semiconductor substrate 200 may be coupled to integrated circuit 500 first such that semiconductor substrate 200 is coupled between the integrated circuit and semiconductor substrate 100. Another example includes placing passive devices 202 on semiconductor substrate 100 and passive devices 102 on semiconductor substrate 200. Either of these examples may provide a semiconductor device that has passive devices 202 (e.g., the capacitors) nearer the integrated circuit than passive devices 102 (e.g., the inductors).

Semiconductor device 1000 and semiconductor device 1000', as described herein, provide semiconductor devices that include voltage regulation components (e.g., passive devices such as inductors and capacitors) in close proximity to the integrated circuit. Thus, semiconductor device 1000 and semiconductor device 1000' are capable of voltage regulation performance that is near or equal to on the die voltage regulation type performance. Semiconductor device 1000 and semiconductor device 1000' provide the high voltage regulation performance in a small form factor device that is implementable in current semiconductor device forms.

Additionally, semiconductor device 1000 and semiconductor device 1000' are formed using processes that are lower in cost and easier to integrate with current processes than die formation processes that integrate voltage regulation components during CMOS processing. Semiconductor device 1000 and semiconductor device 1000' may also be produced with a high yield, especially when individual substrates are coupled to individual integrated circuits as both the substrates and integrated circuits may already be yielded before being coupled.

Using semiconductor substrate 100 or 100' and semiconductor substrate 200 or 200' in semiconductor device 1000 or semiconductor device 1000' also allows passive devices (such as inductors and capacitors) to be formed in a process that is separate from a CMOS process used to form integrated circuit 500. Separating these processes allows the passive devices to be made as any type of passive device desired and with any characteristics or specifications desired without affecting the CMOS process. The passive devices may have tailored characteristics or specifications to provide semiconductor device 1000 or semiconductor device 1000' with better performance characteristics than other voltage regulation implementations. In addition, the passive devices may be scaled as needed for different implementations.

Producing the passive devices on separate substrates may also allow the processing technology for forming the passive devices to be focused on producing better passive devices (e.g., producing inductors or capacitors as close to ideal as possible). Focusing the processing technology on producing passive devices on a single substrate instead of producing these devices in combination with another process may provide improved reliability and operation for the passive devices. For example, close to ideal capacitors may have less equivalent series resistance (ESR) and/or have less parasitic capacitance to ground from their anode or cathode terminals.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A semiconductor device, comprising:
   an integrated circuit comprising an active surface;
   a first metallization coupled to the active surface of the integrated circuit;
   a first semiconductor substrate attached to the integrated circuit with the first metallization, wherein the first semiconductor substrate comprises passive devices of a first type, wherein the passive devices of the first type having at least some depth in the first semiconductor substrate, and wherein at least some of the passive devices of the first type are in contact with at least some of the first metallization;
   a second metallization coupled to the first semiconductor substrate; and
   a second semiconductor substrate attached to the first semiconductor substrate with the second metallization, wherein the second semiconductor substrate comprises passive devices of a second type, wherein the passive devices of the second type having at least some depth in the second semiconductor substrate;

wherein the passive devices of the first type and the passive devices of the second type are different types of passive devices.

2. The device of claim 1, wherein the passive devices of the first type are capacitors and the passive devices of the second type are inductors.

3. The device of claim 1, wherein the passive devices of the first type and the passive devices of the second type are connected to the integrated circuit to provide voltage regulation for the integrated circuit.

4. The device of claim 1, wherein an upper surface of the first semiconductor substrate is in contact with the first metallization, and wherein the passive devices of the first type are positioned at the upper surface of the first semiconductor substrate.

5. The device of claim 1, wherein the second metallization is coupled to an opposing side of the first semiconductor substrate from the first metallization.

6. The device of claim 1, wherein the passive devices of the first type in contact with the first metallization are coupled to the active surface of the integrated circuit with the first metallization.

7. The device of claim 1, wherein at least some of the passive devices of the second type are in contact with at least some of the second metallization.

8. The device of claim 7, further comprising one or more interconnects through the first semiconductor substrate, wherein at least one interconnect is coupled to both the second metallization and the active surface of the integrated circuit, and wherein the at least interconnect couples at least one passive device of the second type to the active surface of the integrated circuit.

9. The device of claim 1, further comprising one or more interconnects through the first semiconductor substrate, wherein at least some of the interconnects couple the first metallization to the second metallization.

10. The device of claim 1, wherein the first metallization directly attaches the integrated circuit to the first semiconductor substrate, and wherein the second metallization directly attaches the first semiconductor substrate to the second semiconductor substrate.

11. The device of claim 1, wherein the active surface includes terminals to active circuitry in the integrated circuit, the device further comprising one or more pillars coupled to the active surface of the integrated circuit on a periphery of the first semiconductor substrate and the second semiconductor substrate, wherein the pillars provide input/output terminals for the integrated circuit, and wherein the terminals on the active surface comprise the input/output terminals and terminals for voltage regulation connections to the integrated circuit using the passive devices of the first type and the passive devices of the second type.

12. A semiconductor device, comprising:
an integrated circuit comprising an active surface;
a first passive semiconductor substrate attached to the active surface of the integrated circuit with a first metallization, wherein the first passive semiconductor substrate includes passive devices of a first type, wherein the passive devices of the first type having at least some depth in the first passive semiconductor substrate;
a second passive semiconductor substrate coupled to the first passive semiconductor substrate with a second metallization, wherein the second passive semiconductor substrate includes passive devices of a second type, wherein the passive devices of the second type having at least some depth in the second passive semiconductor substrate; and
one or more pillars coupled to the active surface of the integrated circuit on a periphery of the first passive semiconductor substrate and the second passive semiconductor substrate, wherein the pillars provide input/output terminals for the integrated circuit;
wherein the passive devices of the first type and the passive devices of the second type are different types of passive devices.

13. The device of claim 12, wherein the passive devices of the first type are capacitors and the passive devices of the second type are inductors.

14. The device of claim 12, wherein the passive devices of the first type and the passive devices of the second type are connected to the integrated circuit to provide voltage regulation for the integrated circuit.

15. The device of claim 12, wherein the active surface includes terminals to active circuitry in the integrated circuit, wherein the pillars provide direct connections to the input/output terminals for the integrated circuit, and wherein the terminals on the active surface comprise the input/output terminals and terminals for voltage regulation connections to the integrated circuit using the passive devices of the first type and the passive devices of the second type.

16. The device of claim 12, further comprising a first set of interconnects through the first semiconductor substrate and a second set of interconnects through the second semiconductor substrate.

17. The device of claim 12, wherein the passive devices of the first type are positioned at an upper surface of the first passive semiconductor substrate, and wherein the passive devices of the first type are in contact with the first metallization.

18. The device of claim 12, wherein the passive devices of the second type are positioned at an upper surface of the second passive semiconductor substrate, and wherein the passive devices of the second type are in contact with the second metallization.

19. The device of claim 12, wherein the pillars are coupled to the active surface of the integrated circuit on a peripheral portion of the integrated circuit, the first passive semiconductor substrate being positioned inside the peripheral portion.

20. The device of claim 12, wherein the pillars extend a distance from the active surface of the integrated circuit that is at least a distance of the second passive semiconductor substrate from the active surface.

* * * * *